United States Patent
Hashimoto

(10) Patent No.: US 9,928,809 B2
(45) Date of Patent: Mar. 27, 2018

(54) DISPLAY PANEL

(71) Applicant: InnoLux Corporation, Miao-Li County (TW)

(72) Inventor: Kazuyuki Hashimoto, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 117 days.

(21) Appl. No.: 15/012,908

(22) Filed: Feb. 2, 2016

(65) Prior Publication Data

US 2017/0221452 A1   Aug. 3, 2017

(51) Int. Cl.
*G11C 19/18*  (2006.01)
*G11C 19/28*  (2006.01)
*G09G 3/36*   (2006.01)
*G09G 3/20*   (2006.01)
*G09G 5/18*   (2006.01)

(52) U.S. Cl.
CPC ............. *G09G 5/18* (2013.01); *G11C 19/28* (2013.01)

(58) Field of Classification Search
CPC ...... G09G 5/10; G09G 3/3677; G09G 3/2092; G11C 19/184; G11C 19/28
See application file for complete search history.

(56) References Cited

U.S. PATENT DOCUMENTS

| | | | |
|---|---|---|---|
| 2008/0117155 A1* | 5/2008 | Li | G09G 3/3677 345/91 |
| 2008/0122875 A1* | 5/2008 | Qi | G09G 3/3677 345/690 |
| 2009/0096735 A1* | 4/2009 | Meng | G09G 3/3677 345/89 |
| 2014/0218274 A1 | 8/2014 | Yamashita | |
| 2015/0279481 A1* | 10/2015 | Sasaki | G11C 19/184 377/69 |
| 2016/0104449 A1* | 4/2016 | Huang | G11C 19/28 345/212 |
| 2017/0061855 A1* | 3/2017 | Tsai | G09G 3/2092 |
| 2017/0154565 A1* | 6/2017 | Qing | G09G 3/3611 |
| 2017/0186393 A1* | 6/2017 | Wang | G09G 3/3677 |

* cited by examiner

*Primary Examiner* — Lin Li
(74) *Attorney, Agent, or Firm* — Bacon & Thomas, PLLC

(57) ABSTRACT

A display panel includes a shift register and an active terminator. The shift register has a drive circuit coupled to one end of a gate line. The active terminator is coupled to the other end of the gate line and includes a first transistor, a second transistor, and a first capacitor. The first transistor has a first terminal connected to a first clock signal, a second terminal connected to the gate line, and a third terminal. The second transistor has a first terminal connected to a first internal node, a second terminal connected to the third terminal of the first transistor, and a third terminal connected to a first DC voltage source. The first capacitor has a first terminal connected to the gate line and a second terminal connected to the third terminal of the first transistor and the second terminal of second transistor.

2 Claims, 10 Drawing Sheets

DISPLAY PANEL

BACKGROUND OF THE INVENTION

1. Field of the Invention

The present invention relates to the technical field of display panels and, more particularly, to a display panel which has active terminals for enhancing driving capability of the gate drivers.

2. Description of Related Art

In general, a display panel includes a panel body, a gate driving circuit and a source driving circuit. The source driving circuit is deployed on the panel body for driving a plurality of pixels of the display panel through a plurality of source lines. The gate driving circuit is deployed on the panel body for driving the pixels through a plurality of gate lines. Moreover, the gate driving circuit includes a shift register for transmitting gate signals to sequentially enable the gate lines that are connected to the shift register, thereby driving the pixels.

Recently, large-size panels have been widely used and, for solving the signal decay problem caused by the overlong transmission distance of the large-size panels, a dual-side gate driving method has been proposed, which distributes the shift register over the opposite sides of the display panel to overcome the signal decay problem. However, it is always a topic to find a circuit design that can more effectively compensate the gate signals. Disposing identical gate drivers on left and right borders of the panel may diminish the signal decaying problem; however this approach makes the panel's border width wider, which is unsatisfactory in actual application. Therefore, it is desirable to provide an improved display panel to mitigate and/or obviate the aforementioned problems.

SUMMARY OF SOME EMBODIMENTS OF THE INVENTION

The object of the present invention is to provide a display panel, which has a shift register and an active terminator. The shift register has a drive circuit coupled to one end of a gate line. The active terminator enhances the driving capability of the gate driver and improves uniformity of a signal on the gate line. Moreover, there is no need to use a high voltage process in the fabrication process so as to dramatically reduce the manufacturing cost.

According to one aspect of the invention, a display panel is provided, which comprises a shift register and an active terminator. The shift register has a drive circuit coupled to one end of a gate line. The active terminator is coupled to the other end of the gate line, and includes a first transistor, a second transistor, and a first capacitor. The first transistor has a first terminal connected to a first clock signal, a second terminal connected to the gate line, and a third terminal. The second transistor has a first terminal connected to an first internal node, a second terminal connected to the third terminal of the first transistor, and a third terminal connected to a first DC voltage source. The first capacitor has a first terminal connected to the gate line and a second terminal connected to the third terminal of the first transistor and the second terminal of second transistor.

Other embodiments of the present disclosure will become more apparent from the following detailed description when taken in conjunction with the accompanying drawings.

DETAILED DESCRIPTION OF THE PREFERRED EMBODIMENT

Figure 1:
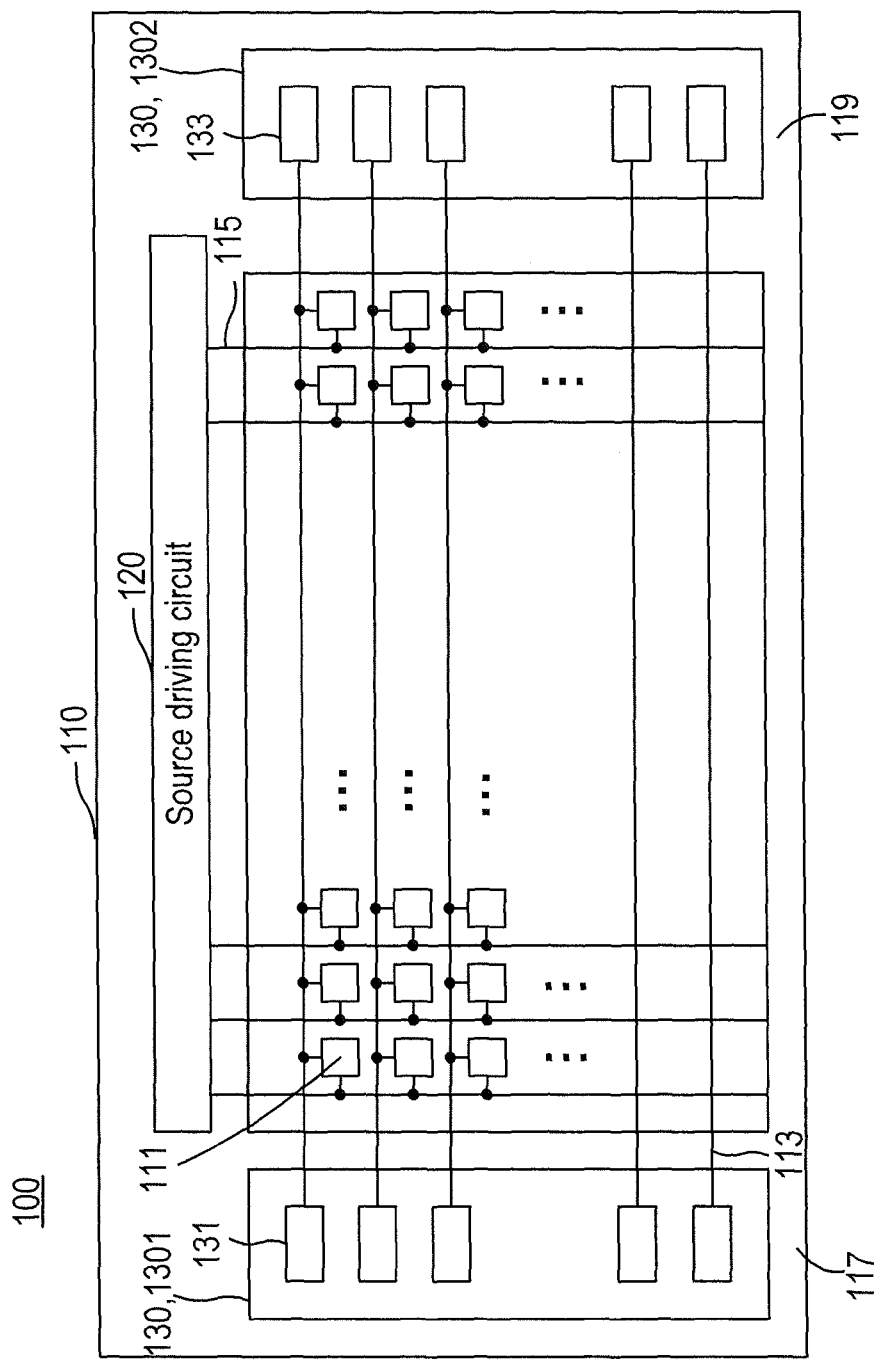
FIG. 1 is a block diagram of a display panel according to a preferred embodiment of the invention.

FIG. 1 is a block diagram of a display panel 100 according to a preferred embodiment of the invention. The display panel 100 includes a panel body 110, a source driving circuit 120, and a gate driving circuit 130. The panel body 110 includes a plurality of pixels 111 arranged in columns and rows and disposed at intersections of a plurality of gate lines 113 and a plurality of source lines 115. The source driving circuit 120 is deployed on the panel body 110 and drives the pixels 111 through the plurality of source lines 115. The scan driving circuit 130 is deployed on the panel body 110 and drives the pixels 111 through the plurality of gate lines 113. The scan driving circuit 130 is divided into two parts 1301, 1302 respectively disposed at first and second sides 117, 119 of the panel body 110 opposite to each other, i.e., at two ends of each of the gate lines 113.

As shown in FIG. 1, the gate driving circuit 130 includes a plurality of stages in series, and each of the stages includes a shift register unit 131 arranged in the part 1301 and an active terminal unit 133 arranged in the part 1302. Specifically, the shift register unit 131 and the active terminal unit 133 in the same stage are at the opposite sides of the panel body 110, i.e. a first side 117 and a second side 119. Two terminals of each of the gate lines 113 are respectively connected to the shift register unit 131 and the active terminal unit 133 in the same stage. That is, each of the gate lines 113 is corresponding to a shift register unit 131 and the active terminal unit 133.

Figure 2:
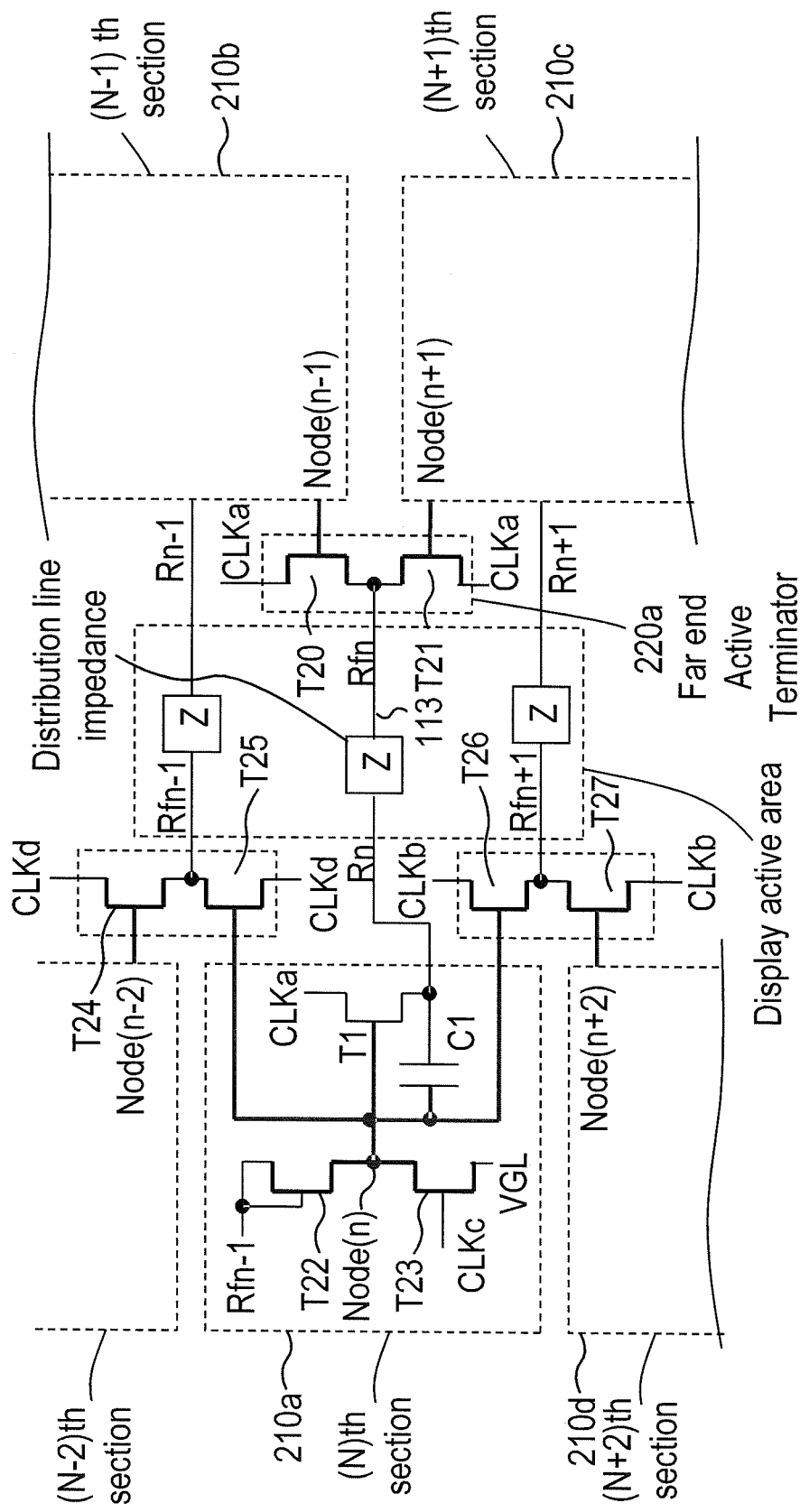
FIG. 2 is a schematic diagram of the shift register units and the active terminal units.
Figure 3:
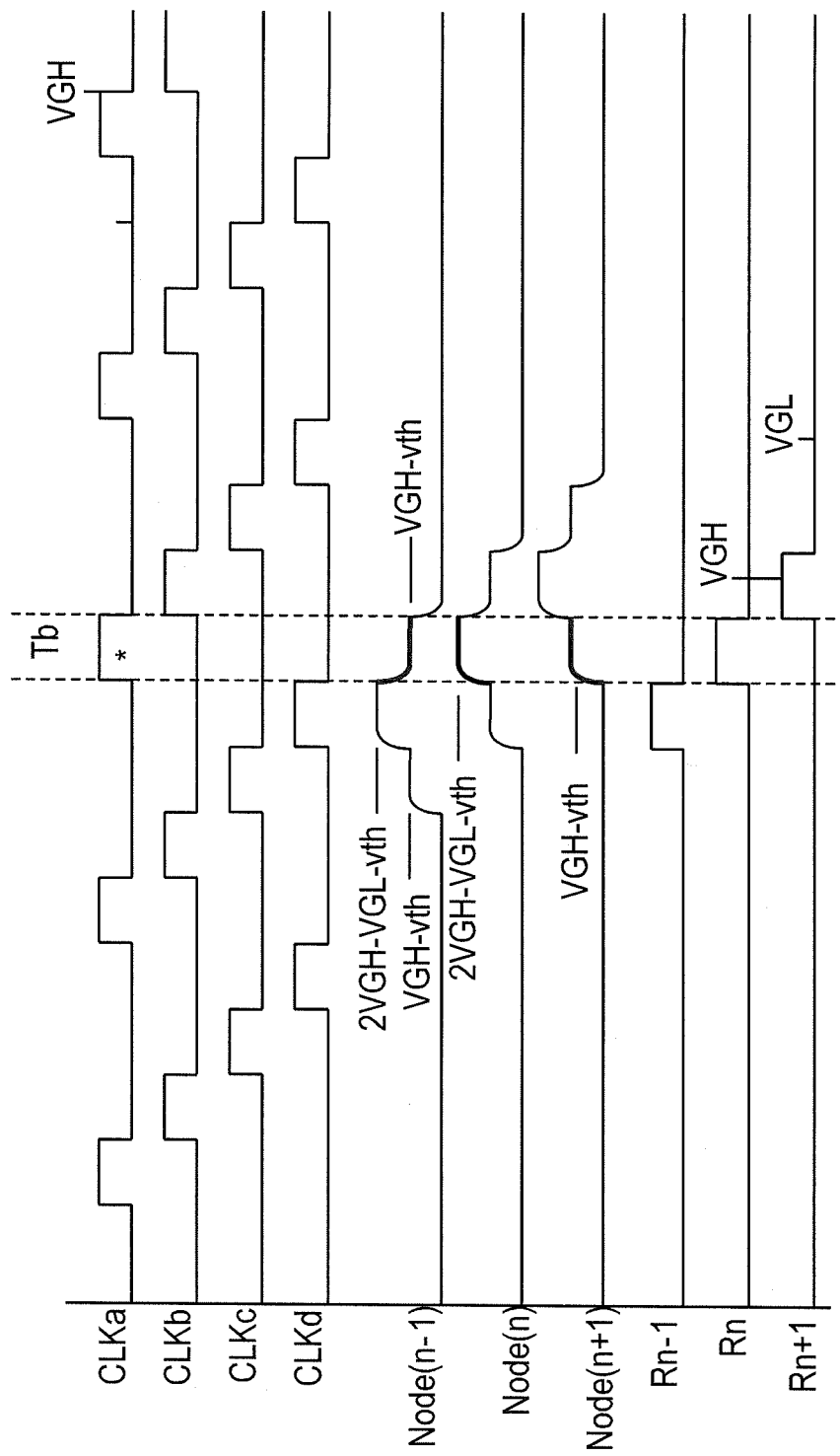
FIG. 3 is a timing diagram of the control signals of the shift register units and the active terminal units shown in FIG. 2.

To overcome the overlong transmission distance for the large-size panels, one solution is shown in FIG. 2 and FIG. 3. FIG. 2 is a schematic diagram of the shift register units 131 and the active terminal units 133 of same stage, and FIG. 3 is a timing diagram of the control signals of the shift register units 131 and the active terminal units 133 of FIG. 2. As shown in FIG. 2, a first shift register unit 210a is deployed at the first side 117 for driving the gate line Rn, and an active terminator 220a is deployed at second side 119 for enhancing the driving capability of the first shift register unit 210a.

As shown in FIG. 3, in a bootstrap period Tb, the voltage of Node(n) is pushed up to 2VGH-VGL-vth, and thus there is a sufficient gate bias voltage of the transistor T1 so that the transistor T1 can be fully turned on in the bootstrap period Tb. However, in the bootstrap period Tb, transistors T20 and T21 in the active terminator 220a have insufficient voltage to drive the far end Rfn of the gate line with VGH. The transistors T20 and T21 are thus not fully turned on to drive the far end Rfn of the gate line, and the driving capabilities of the transistors T20 and T21 are not good enough as that of the transistor T1. Moreover, due to a high voltage (greater than VGH) of the Node(n), all transistors need a high voltage tolerance (greater than VGH-VGL) for Vgs/Vgd/Vds, except for transistor T1.

Figure 4:
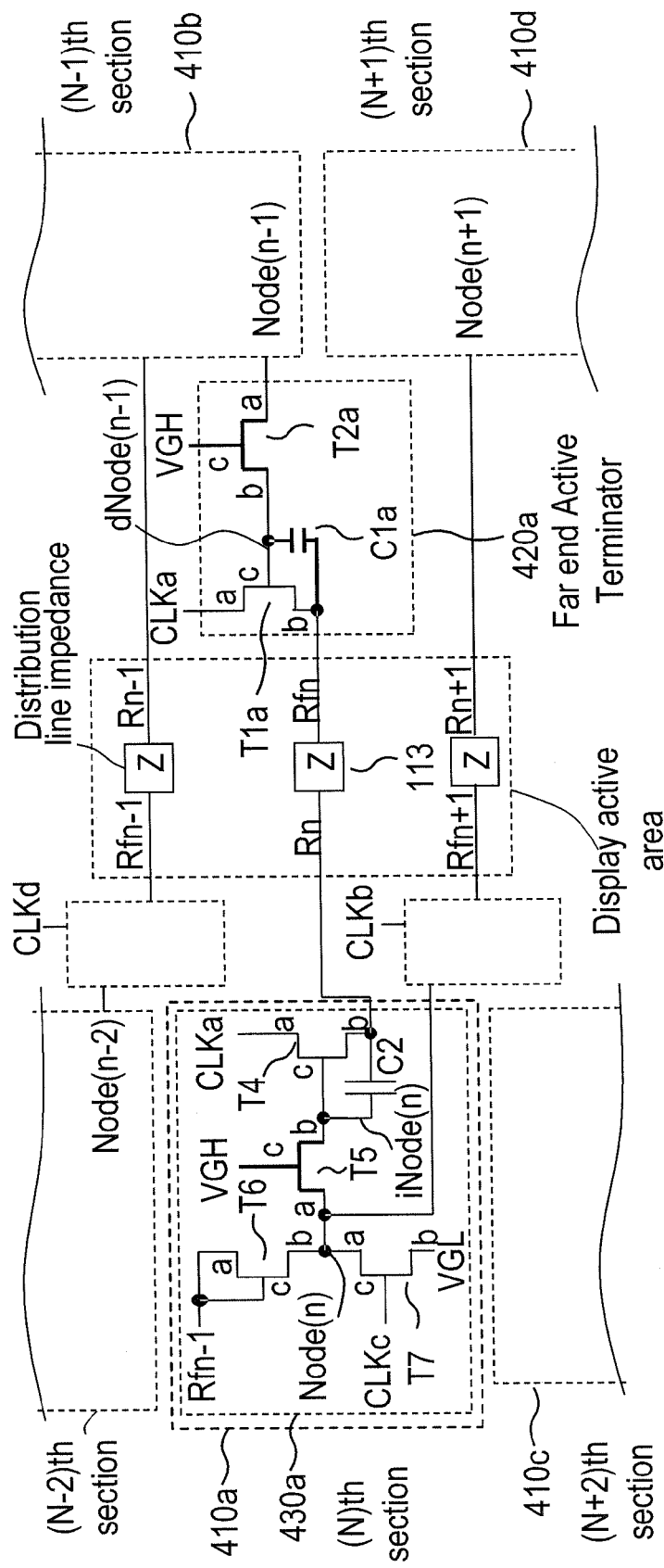
FIG. 4 is a schematic diagram of a plurality of stages of the shift register units and a plurality of the active terminal units according to a preferred embodiment of the invention.

FIG. 4 is a schematic diagram of a plurality of stages of the shift register units and a plurality of the active terminal units according to a preferred embodiment of the invention. As shown in FIG. 4, this embodiment is illustrated by a first shift register unit 410a, a second shift register unit 410b, a third shift register unit 410c, and a fourth shift register unit 410d. Besides, the second shift register unit 410b is the previous stage of the first shift register unit 410a, the third shift register unit 410c is the next stage of the fourth shift register unit 410d, and the third shift register unit 410c is the next second stage of the fourth shift register unit 410d.

The first shift register unit 410a is corresponding to the active terminal unit 420a. The first shift register unit 410a is located on the first side 117 (as shown in FIG. 1) while the active terminal unit 420a is located on the second side 119 (as shown in FIG. 1). Two terminals Rn and Rfn of the gate line 113 are respectively connected to the first shift register unit 410a and the active terminal unit 420a. The active terminal unit 420a is controlled by at least a shift register unit located on the second side 119 (i.e. the opposite side of the first side).

In this example, the active terminal unit 420a is controlled by, for example, a second shift register unit 410b located on the second side 119. Besides, the active terminal unit 420a is controlled by the signal of a second main node Node(n−1) of the second shift register unit 410b, and also by a first clock signal (CLKa) which also synchronously controls the first shift register unit 410a. When the first shift register unit 410a outputs a gate signal to the terminal Rn (on the first side) of the corresponding gate line 113, the second shift register unit 410b controls the active terminal unit 420a for outputting a control signal to the other terminal Rfn (on the second side) of the gate line 113 synchronously, thereby charging the gate line for compensating and enhancing the gate signal. The control signal is generated according to the first clock signal (CLKa), and can be a pulse signal for example.

As shown in FIG. 4, the first shift register unit 410a has a drive circuit 430a coupled to one end Rn of a gate line 113. The active terminator 220a includes a first transistor (T1a), a second transistor (T2a), and a first capacitor (C1a). The first transistor (T1a) has a first terminal (a) connected to a first clock signal (CLKa) and served as an input, a second terminal (b) connected to the gate line 113 and served as an output, and a third terminal (c) served as a control. The second transistor (T2a) has a first terminal (a) connected to a first internal node Node(n−1) of a shift register 410b on a previous row and served as an input, a second terminal (b) connected to the third terminal (c) of the first transistor (T1a)

for controlling the first transistor (T1a), and a third terminal (c) connected to a first DC voltage source (VGH) and served as a control. In the present invention, the first terminal (a) and the second terminal (b) can be a drain and a source or a source and a drain of a MOS transistor. If the transistor is used to be a MOS switch, the first terminal (d) and the second terminal (s) can be exchanged. The first capacitor (C1a) has a first terminal connected to the gate line 113 and a second terminal connected to the third terminal (c) of the first transistor (T1a) and the second terminal (b) of second transistor (T2a).

The drive circuit includes a fourth transistor (T4), a second capacitor (C2), a fifth transistor (T5), a sixth transistor (T6), and a seventh transistor (T7).

The fourth transistor has a first terminal (a) connected to the first clock signal (CLKa), a second terminal (b) connected to the gate line 113, and a third terminal (c) served as a control. The second capacitor (C2) has a first terminal connected to the gate line 113, and a second terminal connected to the third terminal (c) of the fourth transistor (T4). The fifth transistor (T5) has a first terminal (a) connected to a third internal node Node(n) of the shift register 410a on a current row and served as an input, a second terminal (b) connected to the third terminal (c) of the fourth transistor (T4) for controlling the fourth transistor (T4), and a third terminal (c) connected to the first DC voltage source (VGH) and served as a control. The sixth transistor (T6) has a first terminal (a) connected to a third terminal (c) of the sixth transistor (T6) and gate line of previous row Rfn−1, and a second terminal (b) connected to the third internal node Node(n) of the shift register 410a on the current row. The seventh transistor (T7) has a first terminal (a) connected to the third internal node Node(n) of the shift register 410a on a current row, a second terminal (b) connected to a second DC voltage source (VGL), and a third terminal (c) connected to a second clock signal (CLKc).

Specifically, the signal of the second main node Node(n−1) passes through the second transistor (T2a). It is noted that the first transistor (T1a) of the active terminal units 420a is turned on by applying the gate voltage much higher than a high level voltage VGH which is commonly used conventionally, and the gate voltage is boosted by the first capacitor (C1a). Generally, the conductance of N-type transistor becomes higher with the gate voltage higher than VGH. Thus, the use of much higher voltage than VGH to the first transistors (T1a) of the active terminal unit 420a allows smaller size of transistors, thereby causing the required circuit area to be reduced. This is the significant feature to keep the display border narrower whilst the active terminal unit 420a surely compensates the signal decay.

Figure 5:
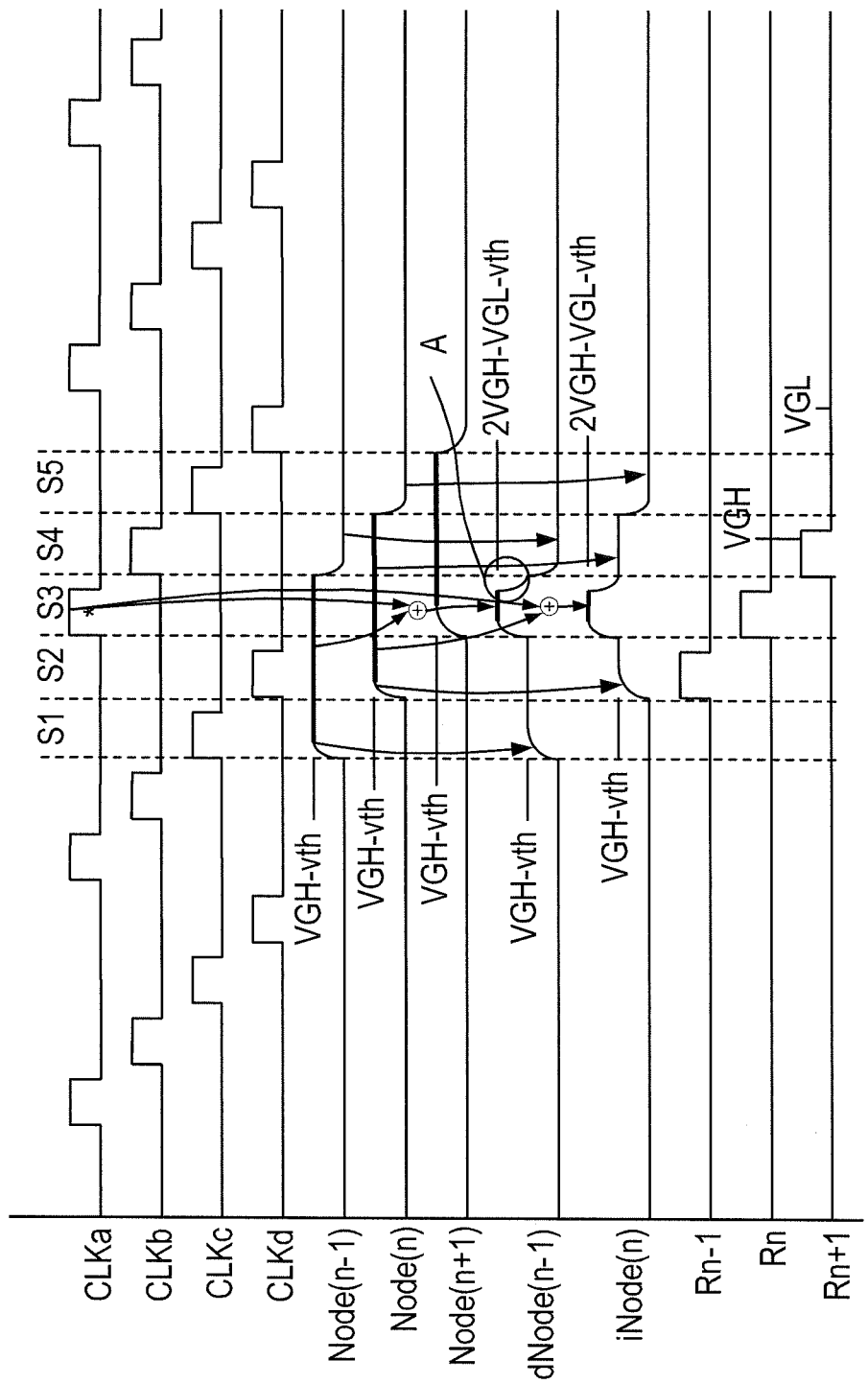
FIG. 5 is a timing diagram of the control signals of the shift register units and the active terminal units in FIG. 4.

FIG. 5 is a timing diagram of the control signals of the shift register units and the active terminal units in FIG. 4. As shown in FIG. 5, the pulse of the third clock signal (CLKb) is non-overlapped with that of the first clock signal (CLKa), the pulse of the second clock signal (CLKc) is non-overlapped with that of the third clock signal (CLKb), and the pulse of the fourth clock signal (CLKd) is non-overlapped with that of the second clock signal (CLKc).

Regarding the operation during the section S1, the signal level of the second main node Node(n−1) goes to VGH-Vth and the second transistor (T2a) is turned on, then the signal level of the node dNode(n−1) goes to VGH-Vth so that the first capacitor (C1a) is charged through the second transistor (T2a), and the first transistor (T1a) is turned on.

During the section S2, the gate signal Rfn−1 (almost equal to the gate signal Rn−1 in FIG. 4) goes to a high level voltage VGH so that the sixth transistor (T6) having a diode connection is turned on, then the signal level of the node Node(n) goes to VGH-Vth so that the second capacitor (C2) is charged through the fifth transistor (T5) and sixth transistor (T6), and the fourth transistor (T4) are turned on. The signal level of internal node iNode(n) goes to VGH-Vth.

During the section S3, the first clock signal CLKa goes to the high level voltage VGH, and the pulse of the first clock signal CLKa is outputted to the gate line 113 through the first transistor (T1a) and flows to the other end Rfn of the gate line 113, and the pulse of the first clock signal CLKa is outputted to the gate line 113 through the fourth transistor (T4) and flows to the end Rn of the gate line 113. Because the second capacitor (C2) with one terminal coupled to the gate line 113 can provide a bootstrapping effect, the level (voltage) of the other terminal of the second capacitor (C2) and the internal node iNode(n) is pushed up to 2VGH-VGL-Vth, which is much higher than the high level voltage VGH, according to the boosting of the first clock signal CLKa. Therefore, the fourth transistor (T4) is fully turned on, so that the end Rn of the gate line 113 can be rapidly charged to go to the high level voltage VGH. The aforementioned description is related to the charging of the gate line 113.

Similarly, during the section S3, the first capacitor (C1a) with one terminal coupled to the gate line 113 can provide a bootstrapping effect, the level (voltage) of the other terminal of the first capacitor (C1a) and the node dNode(n-1) is pushed up to 2VGH-VGL-Vth, which is much higher than the high level voltage VGH, according to the boosting of the first clock signal CLKa. Therefore, the first transistor (T1a) is fully turned on, so that the other end Rfn of the gate line 113 can be rapidly charged to go to the high level voltage VGH. That is, when the first clock signal (CLKa) is in a high voltage state, the first capacitor (C1a) boosts voltage of the third terminal (c) of the first transistor (T1a) to fully turn on the first transistor (T1a).

During the section S3, the charging to the gate line 113 is provided through both of the shift register unit 410a on the first side and the active terminator 420a on the second side synchronously, so as to minimize the gate signal's decay.

During the section S3 and in the circle A, the first clock signal CLKa goes to the low level VGL and the signal level of the node dNode(n-1) goes to the level VGH-vth, thus the first transistor (T1a) is still turned on for performing the discharging to the other end Rfn of the gate line 113.

During the section S4, the first clock signal CLKa remains at the low level VGL and the signal level of the first main node Node(n) remains at the level VGH-vth, the fourth transistor (T4) is still turned on for performing the discharging to the end Rn of the gate line 113.

During the section S5, the first clock signal CLKa and the second main node Node(n-1) remain at the low level VGL, and the signal level of the first main node Node(n) goes to the low level VGL and the first transistor (t1a) and the fourth transistor (T4) are turned off.

Figure 6:
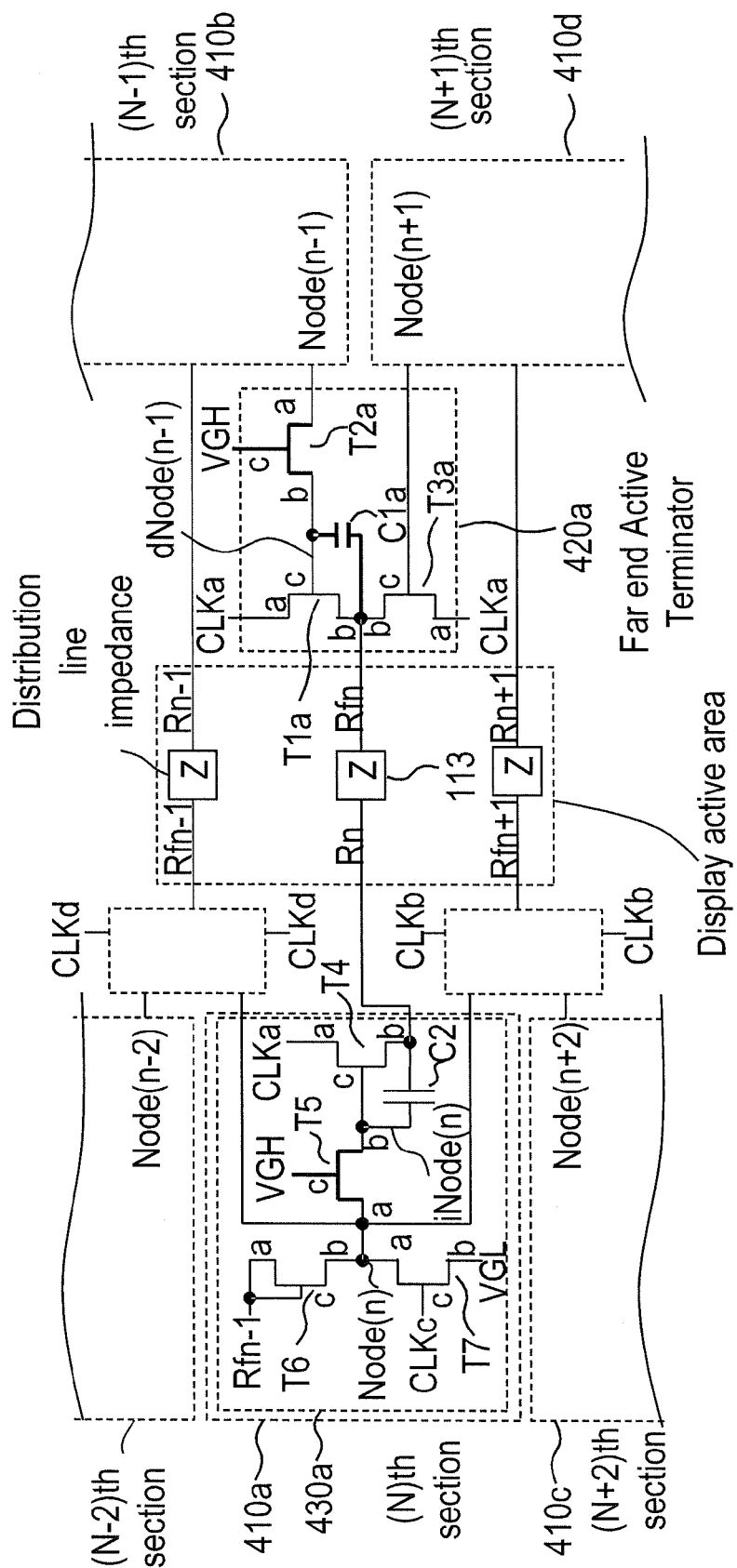
FIG. 6 is another schematic diagram of a plurality of stages of the shift register units and a plurality of the active terminal units according to a preferred embodiment of the invention.
Figure 7:
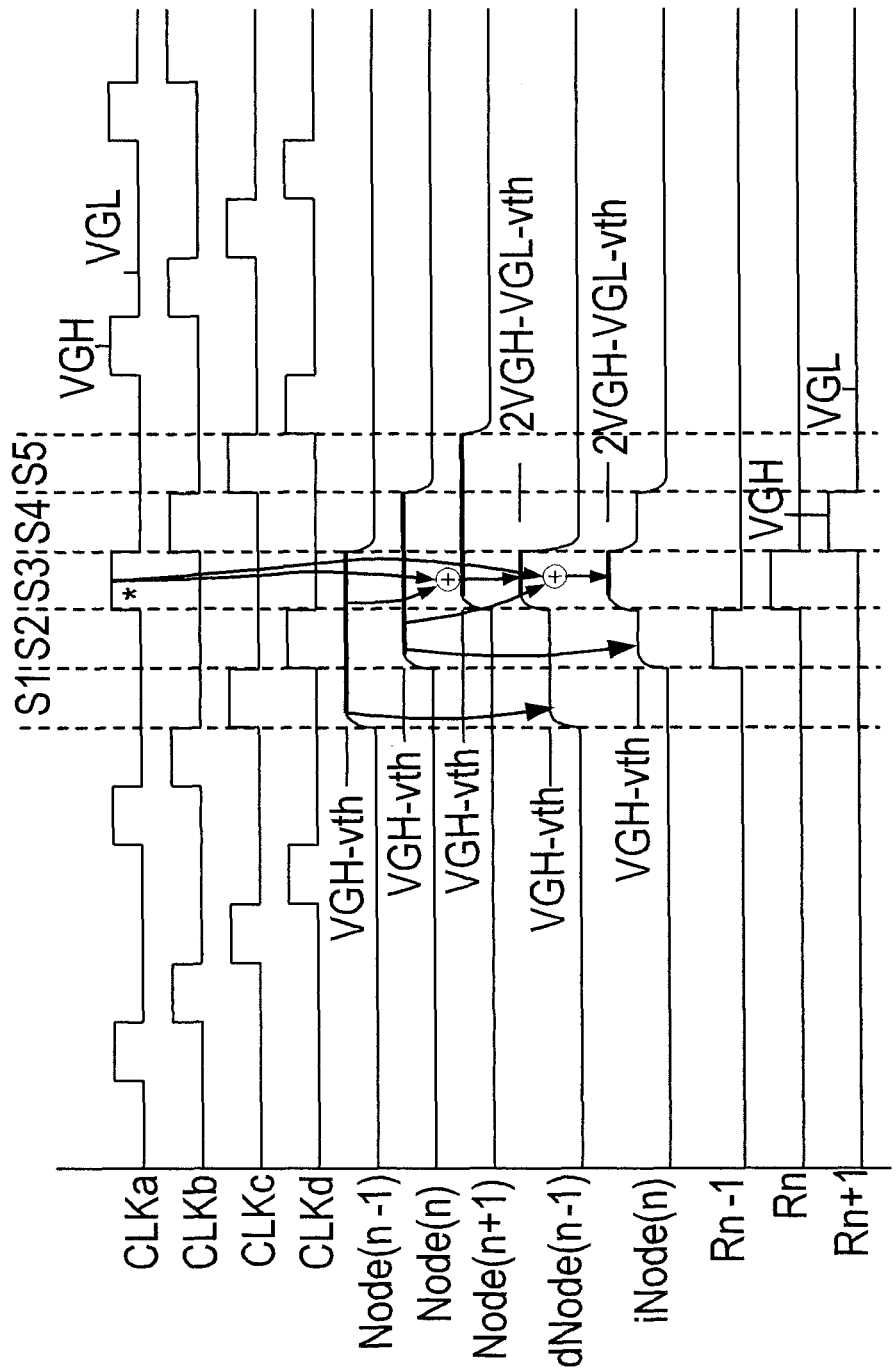
FIG. 7 is a timing diagram of the control signals of the shift register units and the active terminal units shown in FIG. 6.

FIG. 6 is another schematic diagram of a plurality of stages of the shift register units and a plurality of the active terminal units according to a preferred embodiment of the invention. FIG. 7 is a timing diagram of the control signals of the shift register units and the active terminal units shown in FIG. 6.

As shown in FIG. 6, the drive circuit 430a is the same as the drive circuit 430a in FIG. 4. In FIG. 6, the active terminator 220a further includes a third transistor (T3a). The third transistor (T3a) has a first terminal (a) connected to the first clock signal (CLKa), a second terminal (b) connected to the gate line 113, and a third terminal (c) served as a control and connected to a second internal node Node(n+1) of a shift register on a next row.

FIG. 7 is a timing diagram of the control signals of the shift register units and the active terminal units shown in FIG. 6. As shown in FIG. 7, the pulse of the third clock signal (CLKb) is overlapped with that of the first clock signal (CLKa), the pulse of the second clock signal (CLKc) is overlapped with that of the third clock signal (CLKb), and the pulse of the fourth clock signal (CLKd) is overlapped with that of the second clock signal (CLKc).

Regarding the operation during the section S1, the signal level of the second main node Node(n-1) goes to VGH-Vth and the second transistor (T2a) is turned on, then the signal level of the node dNode(n-1) goes to VGH-Vth so that the first capacitor (C1a) is charged through the second transistor (T2a), and the first transistor (T1a) is turned on.

During the section S2, the gate signal Rfn-1 (almost equal to the gate signal Rn-1 in FIG. 6) goes to a high level voltage VGH so that the sixth transistor (T6) having a diode connection is turned on, and then the signal level of the node Node(n) goes to VGH-Vth so that the second capacitor (C2) is charged through the fifth transistor (T5) and the sixth transistor (T6). Subsequently, the signal level of internal node iNode(n) goes to VGH-Vth, and fourth transistor (T4) is turned on.

During the section S3, the first clock signal CLKa goes to the high level voltage VGH, so that the pulse of the first clock signal CLKa is outputted to the gate line 113 through the first transistor (T1a) and flows to the other end Rfn of the gate line 113, and the pulse of the first clock signal CLKa is outputted to the gate line 113 through the fourth transistor (T4) and flows to the end Rn of the gate line 113. Because the second capacitor (C2) with one terminal coupled to the gate line 113 can provide a bootstrapping effect, the level (voltage) of the other terminal of the second capacitor (C2) and the internal node iNode(n) is pushed up to 2VGH-VGL-Vth, which is much higher than the high level voltage VGH, according to the boosting of the first clock signal CLKa. Therefore, the fourth transistor (T4) is fully turned on, so that the end Rn of the gate line 113 can be rapidly charged to go to the high level voltage VGH. The aforementioned description is related to the charging of the gate line 113.

Similarly, during the section S3, the first capacitor (C1a) with one terminal coupled to the gate line 113 can provide a bootstrapping effect, the level (voltage) of the other terminal of the first capacitor (C1a) and the node dNode(n-1) is pushed up to 2VGH-VGL-Vth, which is much higher than the high level voltage VGH, according to the boosting of the first clock signal CLKa. Therefore, the first transistor (T1a) is fully turned on, so that the other end Rfn of the gate line 113 can be rapidly charged to go to the high level voltage VGH. That is, when the first clock signal (CLKa) is in a high voltage state, the first capacitor (C1a) boosts voltage of the third terminal (c) of the first transistor (T1a) to fully turn on the first transistor (T1a).

During the section S3, the charging to the gate line 113 is provided through both of the shift register unit 410a on the first side and the active terminator 420a on the second side synchronously, so as to minimize the gate signal's decay.

During the section S4, the first clock signal CLKa goes to the low level VGL for performing the discharging to the gate line 113. The signal level of the node Node(n-1) goes to low voltage VGL, then the signal level of the node dNode(n-1) goes to low voltage VGL, and the first transistor (T1a) is turned off. The signal level of the node Node(n+1) remains at the level VGH-vth, and the third transistor (T3a) is still turned on. The first terminal (a) of the third transistor (T3a) is coupled to the first clock signal CLKa going to the low level voltage VGL. As a result, the gate line 113 is discharged through the third transistor (T3a). Meanwhile, the signal level of the first main node Node(n) remains at the level VGH-vth, and the fourth transistor (T4) is still turned on. The first terminal (a) of the fourth transistor (T4) is coupled to the first clock signal CLKa going to the low level voltage VGL. As a result, the gate line 113 is discharged through the fourth transistor (T4) and also through the third transistor (T3a). Therefore, the discharging to the gate line 103 can be rapidly completed.

During the section S5, the first clock signal CLKa and the second main node Node(n−1) remain at the low level VGL and the signal level of the first main node Node(n) goes to the low level VGL, and the first transistor (t1a) and the fourth transistor (T4) are turned off. The signal level of the node Node(n+1) remains at the level VGH-vth, and the third transistor (T3a) is still turned on for performing the discharging to the other end Rfn of the gate line 113.

Figure 8:
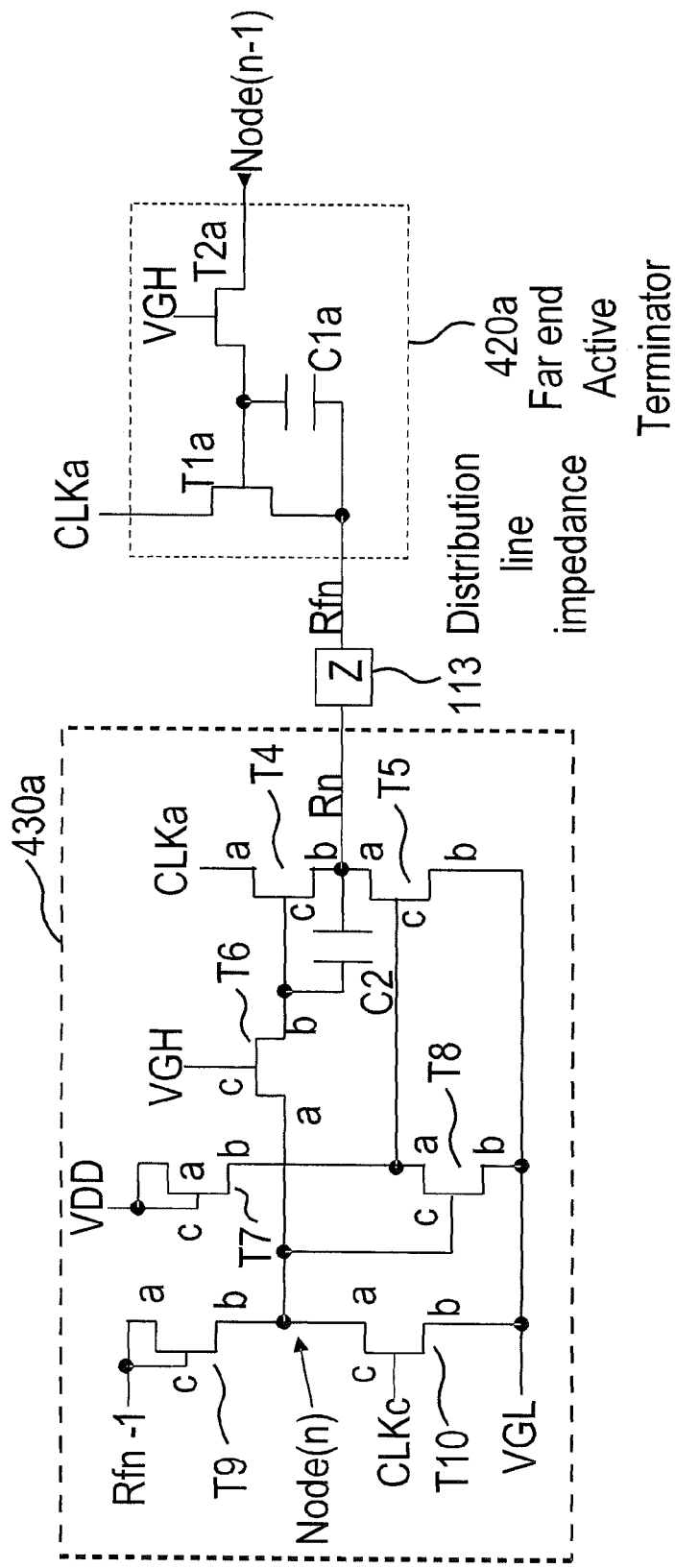
FIG. 8 is a still another schematic diagram of a plurality of stages of the shift register units and a plurality of the active terminal units according to a preferred embodiment of the invention.

FIG. 8 is a still another schematic diagram of a plurality of stages of the shift register units and a plurality of the active terminal units according to a preferred embodiment of the invention. As shown in FIG. 8, the active terminator 220a is the same with that in FIG. 4. The drive circuit 430a includes a fourth transistor (T4), a second capacitor (C2), a fifth transistor (T5), a sixth transistor (T6), a seventh transistor (T7), an eighth transistor (T8), a ninth transistor (T9), and a tenth transistor (T10).

The fourth transistor (T4) has a first terminal (a) connected to the first clock signal (CLKa), a second terminal (b) connected to the gate line 113, and a third terminal (c) served as a control. The second capacitor (C2) has a first terminal connected to the gate line 113, and a second terminal connected to the third terminal (c) of the fourth transistor (T4). The fifth transistor (T5) has a first terminal (a) connected to the gate line, and a second terminal (b) connected to the second DC voltage (VGL).

The sixth transistor (T6) has a first terminal (a) connected to a fourth internal node Node(n) of a shift register 410a on a current row and served as an input, a second terminal (b) connected to the third terminal (c) of the fourth transistor (T4) for controlling the fourth transistor (T4), and a third terminal (c) connected to the first DC voltage source (VGH) and served as a control. The seventh transistor (T7) has a first terminal (a) connected to a third terminal (c) of the seventh transistor (T7) and DC voltage (VDD), and a second terminal (b) connected to the third terminal (c) of the fifth transistor (T5).

The eighth transistor (T8) has a first terminal (a) connected to the third terminal (c) of the fifth transistor (T5), a second terminal (b) connected to the second DC voltage source (VGL), and a third terminal (c) connected to the fourth internal node Node(n) of the shift register 410a on a current row.

The ninth transistor (T9) has a first terminal (a) connected to a third terminal (c) of the ninth transistor (T9) and a previous gate line Rfn−1, and a second terminal (b) connected to the fourth internal node Node(n) of the shift register 410a on a current row. The tenth transistor (T10) has a first terminal (a) connected to the fourth internal node Node(n) of the shift register 410a on a current row, a second terminal (b) connected to the second DC voltage source (VGL), and a third terminal (C) connected to a second clock signal (CLKc).

Figure 9:
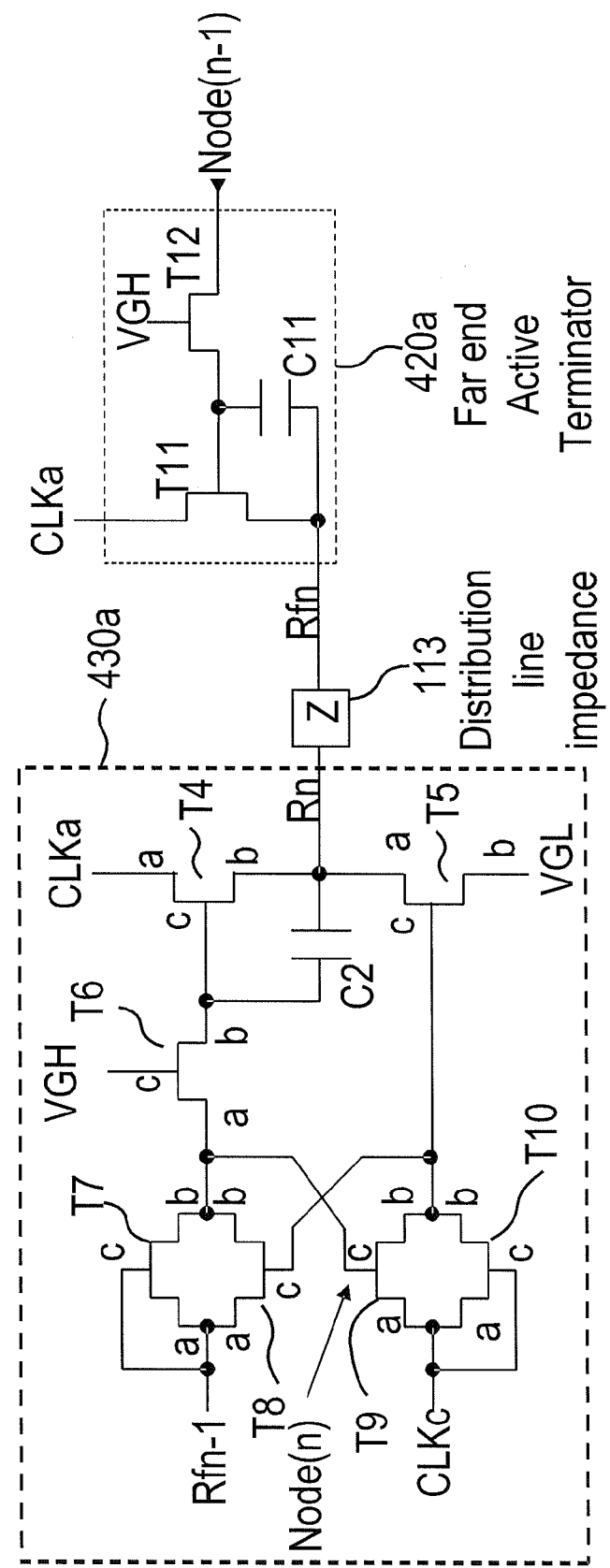
FIG. 9 is a yet another schematic diagram of a plurality of stages of the shift register units and a plurality of the active terminal units according to a preferred embodiment of the invention.

Those skilled in the art can understand the timing diagram of the control signals of the shift register units and the active terminal units in FIG. 8 based on the previous disclosure, and thus a detailed description therefor is deemed unnecessary FIG. 9 is a yet another schematic diagram of a plurality of stages of the shift register units and a plurality of the active terminal units according to a preferred embodiment of the invention. As shown in FIG. 9, the active terminator 220a is the same with that in FIG. 4. The drive circuit 430a includes a fourth transistor (T4), a second capacitor (C2), a fifth transistor (T5), a sixth transistor (T8), a seventh transistor (T7), an eighth transistor (T8), a ninth transistor (T9), and a tenth transistor (T10).

The fourth transistor (T4) has a first terminal (a) connected to the first clock signal (CLKa), a second terminal (b) connected to the gate line 113, and a third terminal (c) served as a control. The second capacitor (C2) has a first terminal connected to the gate line 113, and a second terminal connected to the third terminal (c) of the fourth transistor (T4). The fifth transistor (T5) has a first terminal (a) connected to the gate line 113, and a second terminal (b) connected to the second DC voltage (VGL).

The sixth transistor (T6) has a first terminal (a) connected to a fifth internal node Node(n) of a shift register 410a on a current row and served as an input, a second terminal (b) connected to the third terminal (c) of the fourth transistor (T4) for controlling the fourth transistor, and a third terminal (c) connected to the first DC voltage source (VGH) and served as a control. The seventh transistor (T7) has a first terminal (a) connected to a previous gate line Rfn−1, a second terminal (b) connected to the first terminal (a) of the sixth transistor (T6), and a third terminal (c) connected to the first terminal (a) of the seventh transistor (T7).

The eighth transistor (T8) has a first terminal (a) connected to the first terminal (a) of the seventh transistor (T7), a second terminal (b) connected to the first terminal (a) of the sixth transistor (T6), and a third terminal (c) connected to the third terminal (c) of the fifth transistor (T5). The ninth transistor (T9) has a first terminal (a) connected to a second clock signal (CLKc), a second terminal (b) connected to the third terminal (c) of the fifth transistor (T5), and a third terminal (c) connected to the first terminal (a) of the sixth transistor (T6). The tenth transistor (T10) has a first terminal (a) connected to the first terminal (a) of the ninth transistor (T9), a second terminal (b) connected to the third terminal (c) of the fifth transistor (T5), and a third terminal (c) connected to the second clock signal (CLKc).

Figure 10:
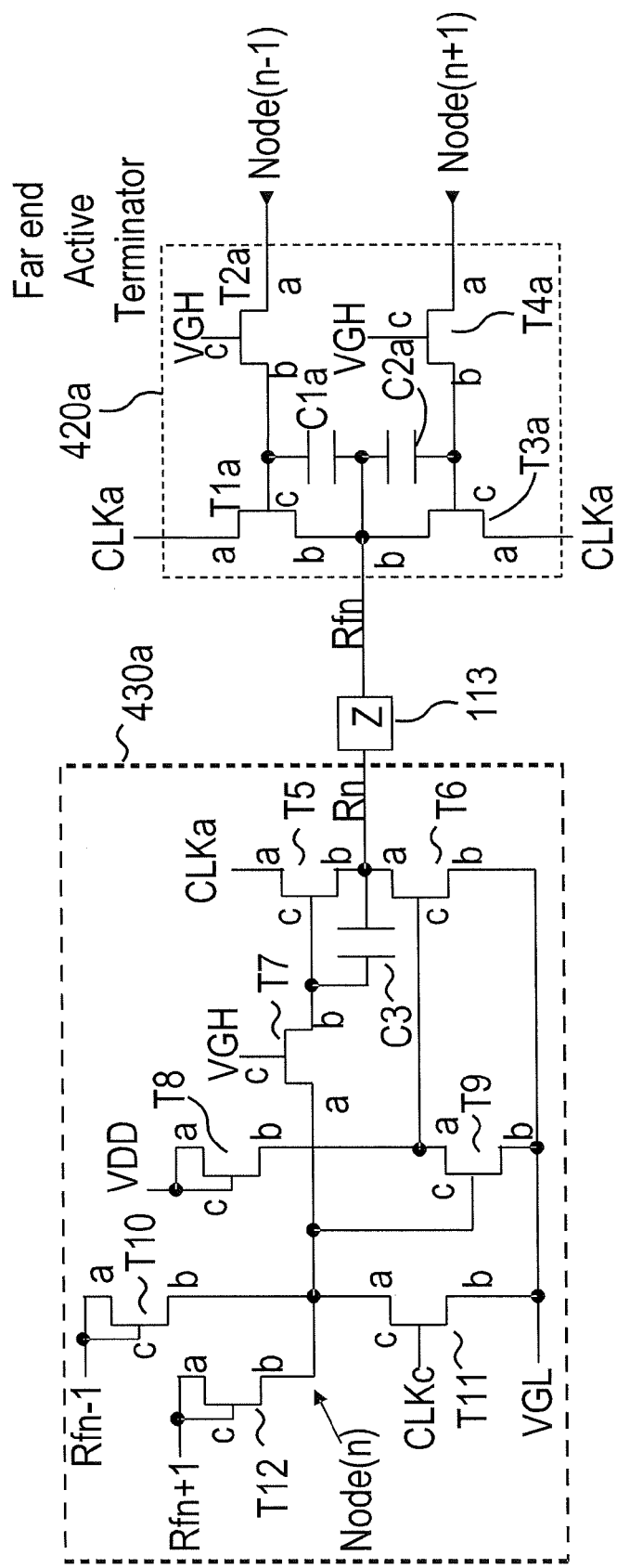
FIG. 10 is a further another schematic diagram of a plurality of stages of the shift register units and a plurality of the active terminal units according to a preferred embodiment of the invention.

FIG. 10 is a further another schematic diagram of a plurality of stages of the shift register units and a plurality of the active terminal units according to a preferred embodiment of the invention. As shown in FIG. 10, the active terminator 420a further includes a third transistor (T3a), a fourth transistor (T4a), and a second capacitor (C2a).

The third transistor (T3a) has a first terminal (a) connected to the first clock signal (CLKa) and served as an input, a second terminal (b) connected to the gate line 113 and served as an output, and a third terminal (c) served as a control.

The fourth transistor (T4a) having a first terminal (a) connected to a sixth internal node Node(n+1) of a shift register 410d on a next row and served as an input, a second terminal (b) connected to the third terminal (c) of the third transistor (T3a) for controlling the third transistor (T3a), and a third terminal (c) connected to the first DC voltage source (VGH) and served as a control.

The second capacitor (C2a) having a first terminal connected to the gate line 113, and a second terminal connected to the third terminal (c) of the third transistor (T3a) and the second terminal (b) of fourth transistor (T4a).

As shown in FIG. 10, drive circuit 430a includes a fifth transistor (T5), a third capacitor (C3), a sixth transistor (T6), a seventh transistor (T7), an eighth transistor (T8), a ninth transistor (T9), a tenth transistor (T10), an eleventh transistor (T11), and a twelfth transistor (T12).

The fifth transistor (T5) has a first terminal (a) connected to the first clock signal (CLKa), a second terminal (b) connected to the gate line 113, and a third terminal (c) served as a control.

The third capacitor (C3) has a first terminal connected to the gate line 113, and a second terminal connected to the third terminal (c) of the fifth transistor (T5).

The sixth transistor (T6) has a first terminal (a) connected to the gate line 113, and a second terminal (b) connected to the second DC voltage (VGL).

The seventh transistor (T7) has a first terminal (a) connected to a seventh internal node Node(n) of a shift register 410a on a current row and served as an input, a second terminal (b) connected to the third terminal (c) of the fifth transistor (T5) for controlling the fifth transistor (T5), and a third terminal (c) connected to the first DC voltage source (VGH) and served as a control.

The eighth transistor (T8) has a first terminal (a) connected to a third terminal (c) of the eighth transistor (T8), and a second terminal (b) connected to the third terminal (c) of the sixth transistor (T6).

The ninth transistor (T9) has a first terminal (a) connected to the third terminal (c) of the sixth transistor (t6), a second terminal (b) connected to the second DC voltage (VGL), and a third terminal (c) connected to the seventh internal node Node(n) of the shift register 410a on the current row.

The tenth transistor (T10) has a first terminal (a) connected to a third terminal (c) of the tenth transistor (T10) and the previous gate line Rfn−1, and a second terminal (b) connected to the seventh internal node Node(n) of the shift register 410a on the current row;

The eleventh transistor (T11) has a first terminal (a) connected to the seventh internal node Node(n) of the shift register 410a on the current row, a second terminal (b) connected to the second DC voltage (VGL), and a third terminal (cg) connected to the second clock signal (CLKc).

The twelfth transistor (T12) has a first terminal (a) connected to a third terminal (c) of the twelfth transistor (T12) and the next gate line Rfn+1, and a second terminal (b) connected to the seventh internal node Node(n) of the shift register on the current row.

From FIG. 10, it is known that the circuit can support up/down bidirectional scan in the gate lines of the display panel. Specifically, it can sequentially scan gate lines R1, . . . , Rn−1, Rn, Rn+1, . . . , Rm in the down direction, and it can also sequentially scan gate lines Rm, . . . , Rn+1, Rn, Rn−1, . . . , R1 in the up direction, wherein n and in are each a positive integer and in is greater than n.

In the present invention, some transistors are MOS switches, and it is noted that the first terminal (a) and the second terminal (b) of a MOS switch can be exchanged.

As cited, in the present invention, as shown in FIG. 4, when the voltage of iNode(n) goes up to 2VGH-VGL-vth, the fifth transistor (T5) is turned off, and thus the high voltage 2VGH-VGL-vth will not be transmitted to the transistors T6 and T7. Similarly, when the voltage of dNode (n−1) goes up to 2VGH-VGL-vth, the second transistor (T2a) is turned off, so that the high voltage 2VGH-VGL-vth will not be transmitted to the second main node Node(n−1) in the second shift register 410b. Thus, in the manufacturing process, the transistors T6 and T7 and the circuit of the second shift register 410b do not need to use a high voltage process design kit (PDK), so as to dramatically reduce the manufacturing cost of.

Moreover, with the boosting effect of capacitors C1a and C2, the first transistor (T1a) and the fourth transistor (T4) can be fully turned on, so that the line 113 can be rapidly charged to go to the high level voltage VGH. In the present invention, the active terminator 420a can enhance the driving capability of the gate driver 430a and improves uniformity of a signal on the gate line 113.

Although the present disclosure has been explained in relation to its various embodiments, it is to be understood that many other possible modifications and variations can be made without departing from the spirit and scope of the invention as hereinafter claimed.

What is claimed is:

1. A display panel, comprising:
   a shift register having a drive circuit coupled to one end of a gate line; and
   an active terminator coupled to the other end of the gate line, the active terminator including:
   a first transistor having a first terminal connected to a first clock signal, a second terminal connected to the gate line, and a third terminal;
   a second transistor having a first terminal connected to a first internal node, a second terminal connected to the third terminal of the first transistor, and a third terminal connected to a first DC voltage source; and
   a first capacitor having a first terminal connected to the gate line and a second terminal connected to the third terminal of the first transistor and the second terminal of second transistor,
   wherein the drive circuit comprises a fourth transistor, a second capacitor, a fifth transistor, a sixth transistor, a seventh transistor, an eighth transistor, a ninth transistor, and a tenth transistor, and wherein
   the fourth transistor has a first terminal connected to the first clock signal, a second terminal connected to the gate line, and a third terminal;
   the second capacitor has a first terminal connected to the gate line, and a second terminal connected to the third terminal of the fourth transistor;
   the fifth transistor has a first terminal connected to the gate line, and a second terminal connected to a second DC voltage;
   the sixth transistor has a first terminal connected to a fifth internal node, a second terminal connected to the third terminal of the fourth transistor, and a third terminal connected to the first DC voltage source;
   the seventh transistor has a first terminal connected to a previous gate line, a second terminal connected to the first terminal of the sixth transistor, and a third terminal connected to the first terminal of the seventh transistor;
   the eighth transistor has a first terminal connected to the first terminal of the seventh transistor, a second terminal connected to the first terminal of the sixth transistor, and a third terminal connected to the third terminal of the fifth transistor;
   the ninth transistor has a first terminal connected to a second clock signal, a second terminal connected to the third terminal of the fifth transistor, and a third terminal connected to the first terminal of the sixth transistor; and
   the tenth transistor has a first terminal connected to the first terminal of the ninth transistor, a second terminal connected to the third terminal of the fifth transistor, and a third terminal connected to the second clock signal.

2. The display panel as claimed in claim 1, wherein, when the first clock signal is in a high voltage state, the first capacitor boosts voltage of the third terminal of the first transistor to turn on the first transistor.

\* \* \* \* \*